(12) United States Patent
Tanaka

(10) Patent No.: US 9,362,168 B2
(45) Date of Patent: Jun. 7, 2016

(54) NON-VOLATILE MEMORY DEVICE AND METHOD FOR MANUFACTURING SAME

(71) Applicant: Kabushiki Kaisha Toshiba, Minato-ku (JP)

(72) Inventor: Toshiharu Tanaka, Mie-ken (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 162 days.

(21) Appl. No.: 14/150,193

(22) Filed: Jan. 8, 2014

(65) Prior Publication Data

US 2015/0062993 A1    Mar. 5, 2015

Related U.S. Application Data

(60) Provisional application No. 61/871,717, filed on Aug. 29, 2013.

(51) Int. Cl.
| | |
|---|---|
| *G11C 5/06* | (2006.01) |
| *H01L 21/768* | (2006.01) |
| *H01L 27/06* | (2006.01) |
| *H01L 27/105* | (2006.01) |

(52) U.S. Cl.
CPC ............ *H01L 21/76897* (2013.01); *G11C 5/06* (2013.01); *H01L 27/0688* (2013.01); *H01L 27/1052* (2013.01)

(58) Field of Classification Search
CPC   G11C 5/06; H01L 21/76897; H01L 27/0688; H01L 27/1052

USPC .............................................. 365/63; 438/675
See application file for complete search history.

(56) References Cited

U.S. PATENT DOCUMENTS

| | | | |
|---|---|---|---|
| 5,578,524 A | 11/1996 | Fukase et al. | |
| 6,043,145 A | 3/2000 | Suzuki et al. | |
| 2008/0070402 A1 | 3/2008 | Kotani et al. | |
| 2011/0183488 A1* | 7/2011 | Takaishi | ............ H01L 21/76816 438/381 |
| 2012/0261638 A1 | 10/2012 | Sills et al. | |
| 2013/0148400 A1* | 6/2013 | Murooka | .................. G11C 5/06 365/63 |
| 2013/0187118 A1 | 7/2013 | Murooka | |

* cited by examiner

*Primary Examiner* — Toan Le
(74) *Attorney, Agent, or Firm* — Oblon, McClelland, Maier & Neustadt, L.L.P.

(57) ABSTRACT

According to an embodiment, a non-volatile memory device includes a first wiring provided on an underlayer, a first memory cell array provided on the first wiring and including a plurality of memory cells, a first select element including a first control electrode provided between the first wiring and the first memory cell array. The device also includes a second wiring provided at the same level as the first wiring and electrically connected to the first control electrode, and a first plug electrically connecting the first control electrode and the second wiring, one end of the first plug being in contact with the second wiring, and a side surface of the first plug being in contact with the first control electrode.

12 Claims, 10 Drawing Sheets

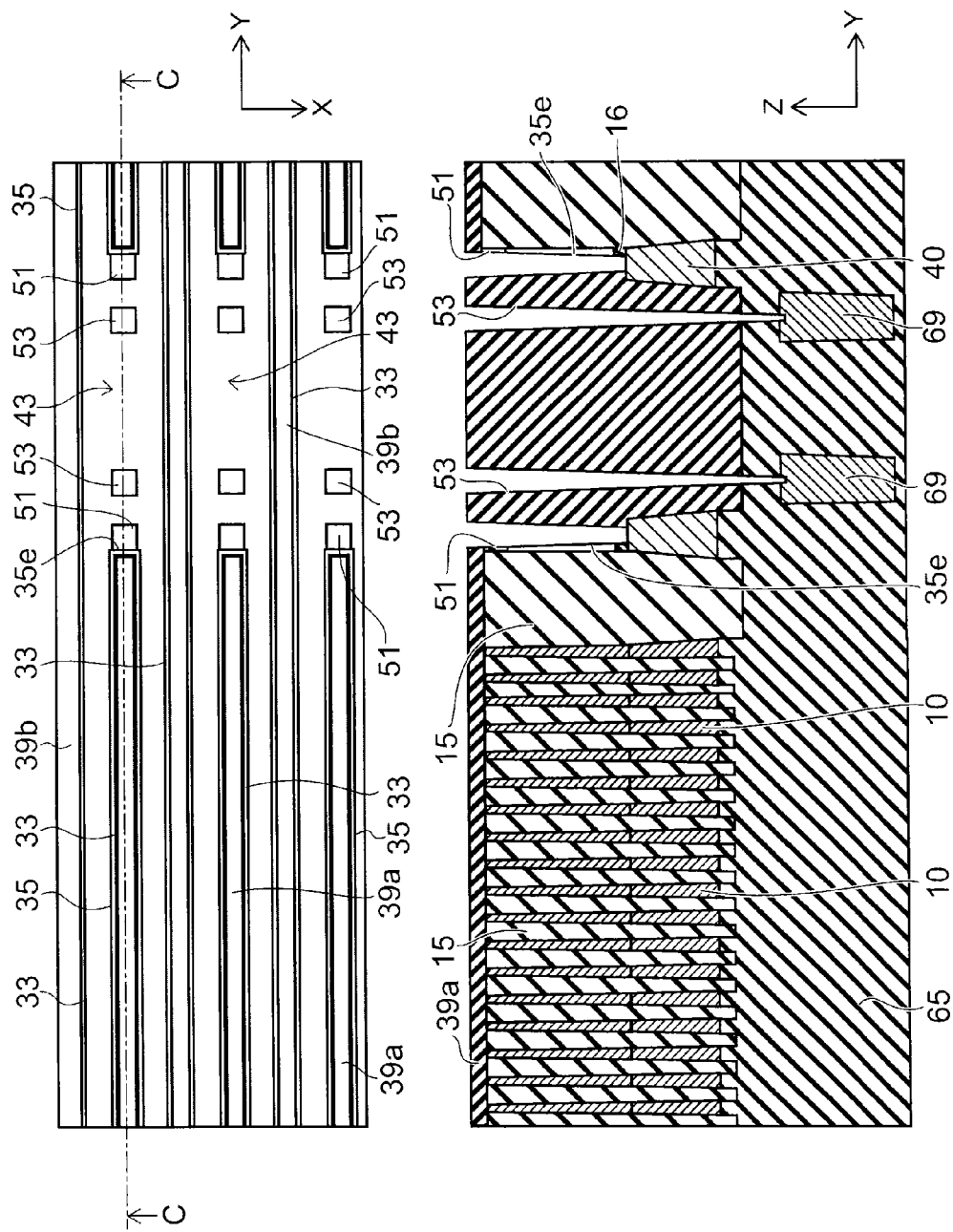

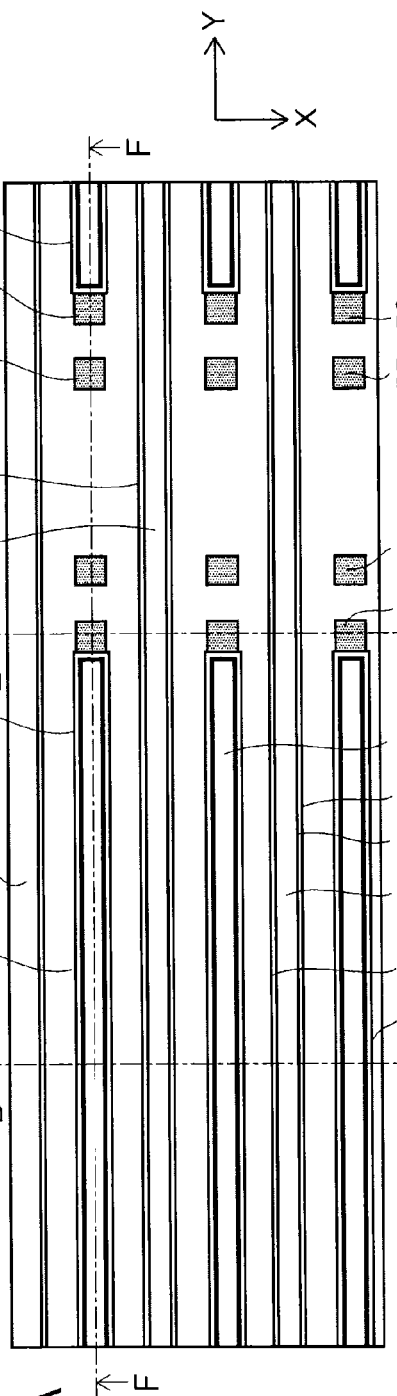
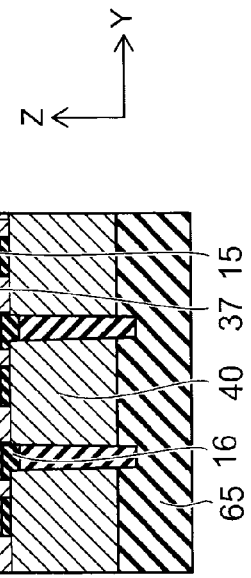
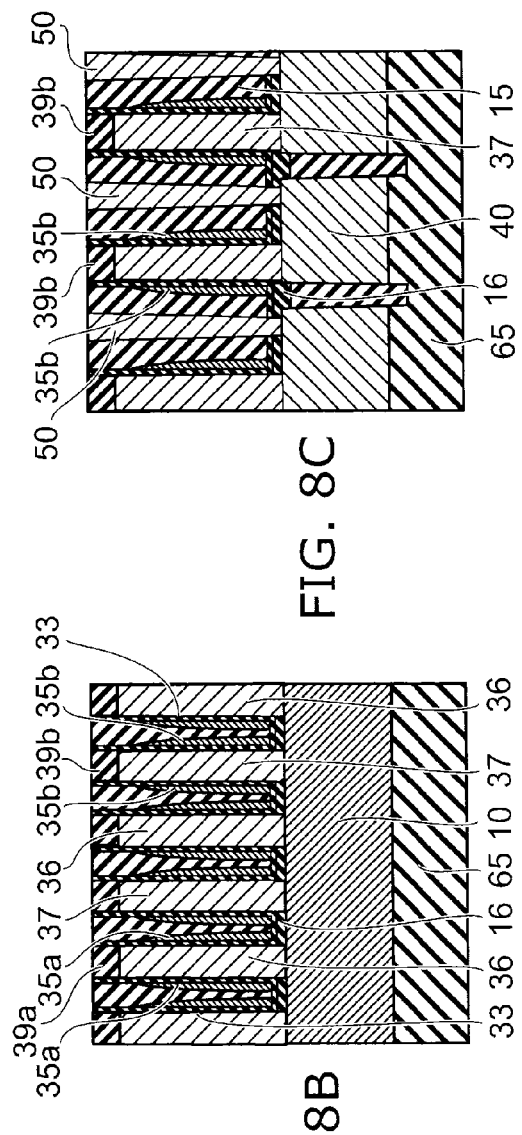
FIG. 8A
FIG. 8B
FIG. 8C

NON-VOLATILE MEMORY DEVICE AND METHOD FOR MANUFACTURING SAME

CROSS-REFERENCE TO RELATED APPLICATIONS

This application is based upon and claims the benefit of priority from U.S. Provisional Patent Application 61/871,717, filed on Aug. 29, 2013; the entire contents of which are incorporated herein by reference.

FIELD

Embodiments are generally related to a non-volatile memory device and a method for manufacturing the same.

BACKGROUND

A memory cell array having a three-dimensional structure has been studied for realizing next-generation non-volatile memory devices. For example, such a memory cell array is disposed above the drive circuit, which is provided in a semiconductor substrate. Select elements are provided between the drive circuit and the memory cell array, and each select element may be used to select one or more of the memory cells included in the memory cell array. Such a memory device may include vertical wirings (contact electrodes) that electrically connect the drive circuit and the memory cell array, and horizontal wirings that control the select elements.

On the other hand, when the number of wirings connecting the memory cell array and the drive circuit is increased, it leads to increase memory capacity, for example. Thus, a layout and structure of wirings are adjusted for shrinking the memory device.

BRIEF DESCRIPTION OF THE DRAWINGS

FIGS. 4 to 9B are schematic views showing one example of the manufacturing process of the non-volatile memory device according to the embodiment.

DETAILED DESCRIPTION

Figure 1:
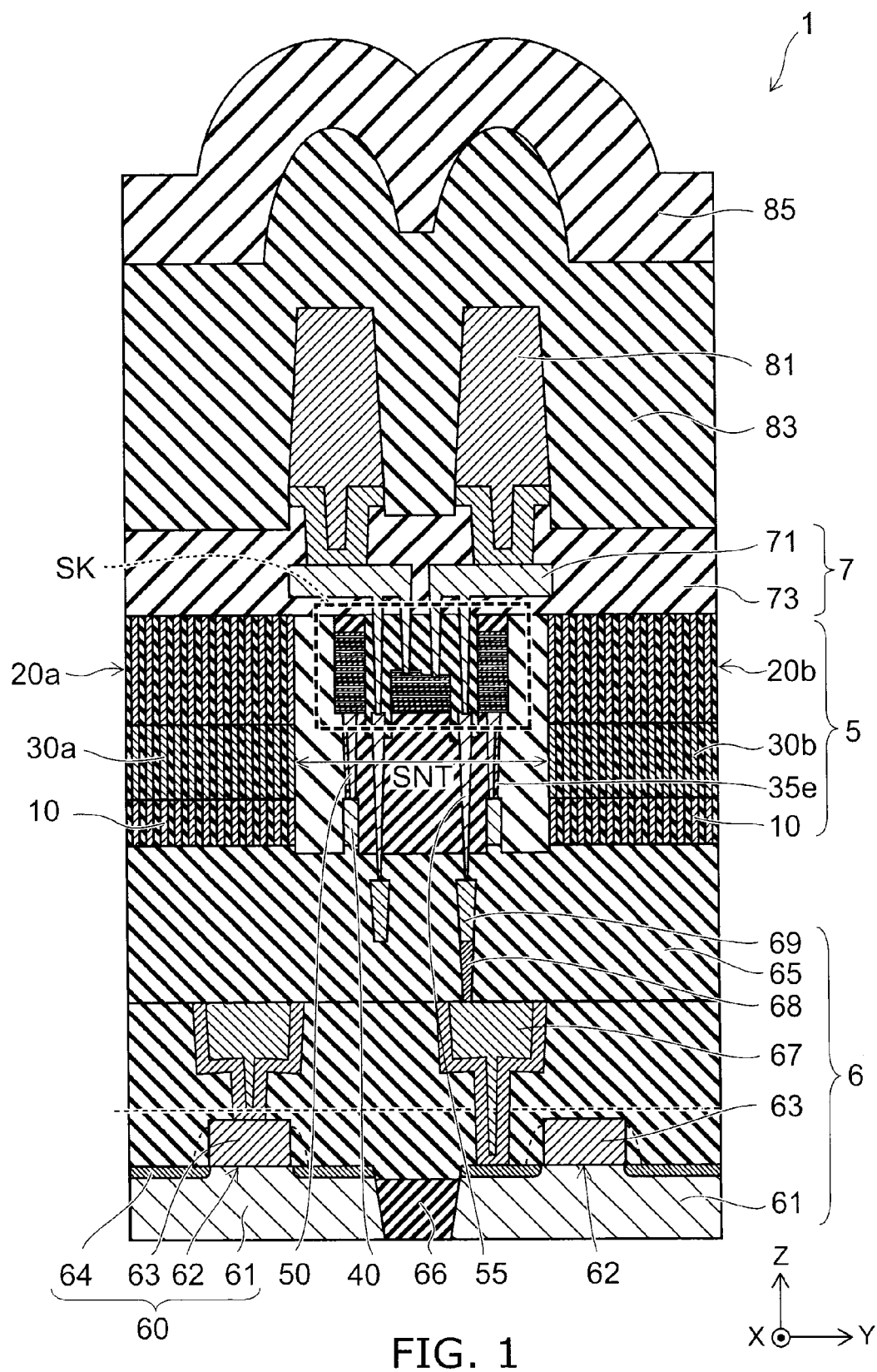
FIG. 1 is a schematic cross-sectional view showing one example of a non-volatile memory device according to an embodiment.

According to an embodiment, a non-volatile memory device includes a first wiring provided on an underlayer, a first memory cell array provided on the first wiring and including a plurality of memory cells, a first select element including a first control electrode provided between the first wiring and the first memory cell array. The device also includes a second wiring provided at the same level as the first wiring and electrically connected to the first control electrode, and a first plug electrically connecting the first control electrode and the second wiring, one end of the first plug being in contact with the second wiring, and a side surface of the first plug being in contact with the first control electrode.

Hereinbelow, embodiments are described with reference to the drawings. Identical components in the drawings are marked with the same reference numerals, and a detailed description thereof is omitted as appropriate and different components are described. The drawings are schematic or conceptual; and the relationships between the thickness and width of portions, the proportions of sizes among portions, etc. are not necessarily the same as the actual values thereof. Further, the dimensions and proportions may be illustrated differently among drawings, even for identical portions.

FIG. 1 is a schematic cross-sectional view of a non-volatile memory device 1 according to an embodiment. The non-volatile memory device 1 has a three-dimensional structure, and includes a memory portion 5 provided on an underlayer, a circuit 6 provided between the memory portion 5 and the underlayer, and a wiring layer 7 provided on the memory unit 5, for example.

The underlayer is a silicon wafer, for example, and the circuit 6 that serves as a driver of the memory portion 5 is provided on the upper surface of the underlayer. The circuit 6 may be a CMOS logic circuit, for example. The underlayer is not limited to a silicon wafer, and may be a compound semiconductor substrate of silicon carbide (SiC) or the like, or a semiconductor layer or an insulating layer formed on a substrate, for example.

Figure 2:
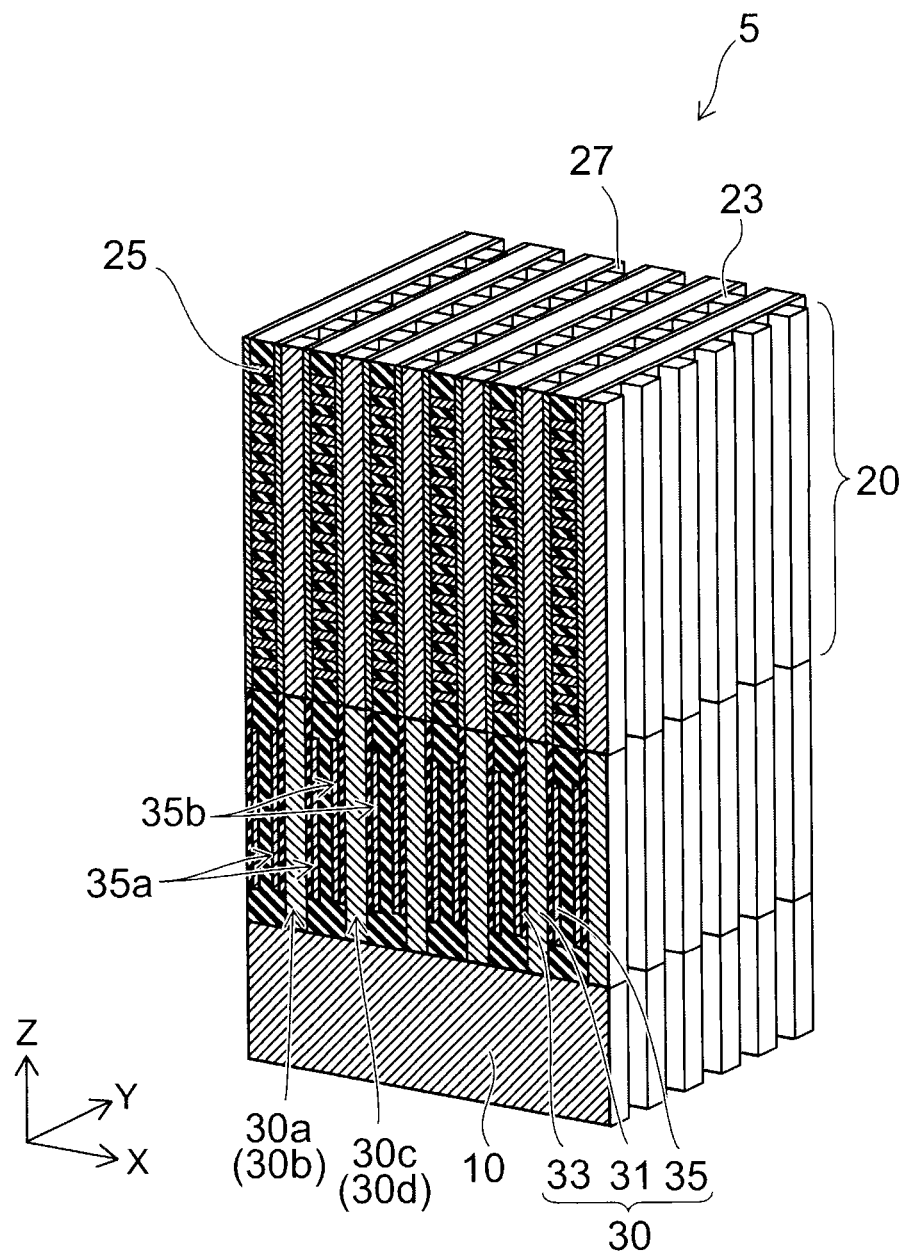
FIG. 2 is a perspective view schematically showing one example of the memory portion of the non-volatile memory device according to the embodiment.

FIG. 2 is a perspective view schematically showing one example of the memory unit 5 of the non-volatile memory device 1 according to the embodiment. The memory unit 5 includes a first wiring (hereinafter, a global bit line 10) provided on the underlayer, a memory cell array 20 provided on the first wiring, and a select element, for example, a select transistor 30 provided between the global bit line 10 and the memory cell array 20.

The global bit line 10 extends in a first direction (hereinafter, the X-direction) parallel to the upper surface of the underlayer, and select transistors 30 are aligned on the global bit line 10. Each of the select transistors 30 includes an element portion 31 and a control electrode (hereinafter, a gate electrode 35). The element portion 31 is connected to the global bit line 10, and extends in a second direction (the Z-direction) perpendicular to the upper surface of the underlayer. The gate electrode 35 extends in a third direction (the Y-direction) crossing the X-direction in a plane parallel to the upper surface of the underlayer, and faces the side surface of the element portion 31 via a gate insulating film 33. That is, the select transistor 30 is a thin film transistor (TFT) through which a current flows in the Z-direction, for example.

In this example, the first direction is the X-direction, the second direction is the Z-direction, and the third direction is the Y-direction. The extending directions of the wirings are orthogonal to one another, but are not limited to a case where the wirings are provided strictly orthogonal to each other. Some shifts from strictly orthogonal crossing may be allowable, for example, due to an accuracy limit of manufacturing technique etc. The third direction is not limited to the Y-direction orthogonal to the X-direction, and it may be sufficient in some cases to provide the wirings so that the third direction crosses the X-direction in the X-Y plane.

The memory cell array 20 includes local bit lines 23 (fifth wirings). Each local bit line 23 is connected to the element portion 31, and extends in the Z-direction. That is, the select transistor 30 on/off-controls the electrical connection between the global bit line 10 and the local bit line 23. Word lines 25 (fourth wirings) are provided via a memory layer 27 between the local bit lines 23 adjacent to each other in the X-direction. The word lines 25 are stacked via insulating films in the Z-direction.

Figure 3:
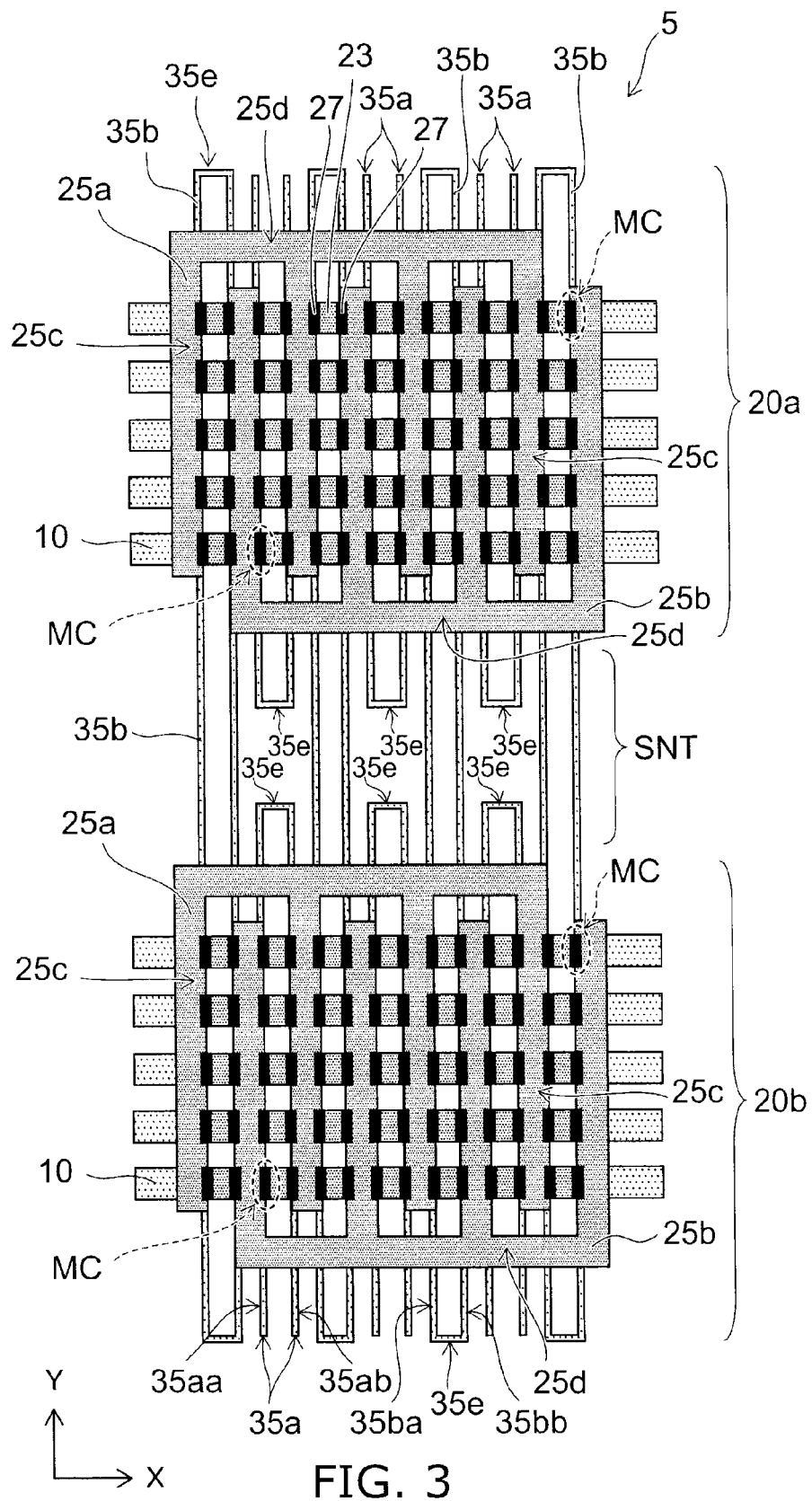
FIG. 3 is a transparent view showing one example of the memory portion according to the embodiment.

FIG. 3 is a transparent view from the upper side, showing one example of the memory portion 5 according to the embodiment. FIG. 3 shows an arrangement of the word lines 25 with respect to the local bit lines 23. In FIG. 3, the illustration of the insulating films provided between global bit lines 10, and between local bit lines 23 in the Y-direction is omitted for convenience in viewing of the drawing.

As shown in FIG. 3, the global bit lines 10 extending are arranged in parallel so as to be aligned in the Y-direction. A plurality of local bit lines 23 are arranged on a global bit line 10, and aligned in the X-direction. Local bit lines 23 are also arranged so as to be aligned in the Y-direction. That is, local bit lines 23 are arranged in a matrix configuration on the global bit lines 10.

As shown in FIG. 3, at one level of the word lines 25 stacked in the Z-direction, word line combs 25a and 25b are provided. Each word line combs 25a and 25b has an extending portion 25c extending in the Y-direction between local bit lines 23 adjacent to each other in the X-direction and a common portion 25d that electrically bundles the extending portions 25c, for example. The extending portions 25c that are disposed in every other space between local bit lines 23 adjacent to each other in the X-direction are electrically bundled by the common portion 25d. The word line comb 25a is provided so that each extending portion 25c thereof is disposed on one side of each local bit line 23 in the X-direction, and the word line comb 25b is provided so that each extending portion 25c thereof is disposed on the other side.

A memory cell MC is formed in each portion where the local bit line 23 and the word line 25 (the extending portions 25c) face each other across the memory layer 27. That is, the memory cell array 20 includes memory cells (MC) that are three-dimensionally arranged therein.

In the specification, the word line combs 25a and 25b are collectively referred to as the word line 25. Also for other components, there are a case where components of the same kind are distinguished by being marked with different reference numerals and a case where components of the same kind are collectively referred to using one reference numeral.

As shown in FIG. 3, the gate electrode 35 of the select transistor 30 extends in the Y-direction below the word line 25. The gate electrode 35 faces the side surface of the element portion 31 provided under each local bit line 23 via the gate insulating film 33.

The gate electrode 35 is provided on both sides of the element portion 31 in the X-direction, and both gate electrodes 35 face side surfaces of the element portion 31 opposite to each other, respectively. A gate electrode 35a and a gate electrode 35b are disposed alternately.

A shunt portion SNT is disposed between a memory cell array 20a and a memory cell array 20b.

The gate electrode 35a has a first portion 35aa extending in the Y-direction, a turning portion 35e, and a second portion 35ab extending in a direction opposite to the Y-direction, for example. The first portion 35aa and the second portion 35ab face side surfaces of one element portion 31 opposite to each other, respectively.

On the other hand, the gate electrode 35b has a first portion 35ba extending in the Y-direction, a turning portion 35e, and a second portion 35bb. The first portion 35ba and the second portion 35bb face side surfaces of one element portion 31 opposite to each other, respectively. Here, the turning portion 35e is disposed in the shunt portion SNT. The layout of the gate electrode 35a and the gate electrode 35b may be symmetrical in the Y-direction. Here, a contact portion is formed at the turning portion 35e. By using such a layout, contact portions (where a plug 50 is to be formed) adjacent to each other in the X-direction can be disposed in a different position in Y-direction, and the distance between them can be widened. Placing turning portions 35e so as to align in the X-direction can make it easy to connect the plug to the gate electrode 35.

In the memory unit 5 according to the embodiment, a group of memory cells arranged along one local bit line 23 (for example, a first cell group) and another group of memory cells connected to one word line 25 (for example, a second cell group) share one memory cell. The first cell group is selected by turning one select transistor 30 ON-state, and applying a voltage to the one word line 25 biases the second cell group. Thus, the memory cell shared with the first cell group and the second cell group can operate under the bias provided between the one local bit line 23 and the one word line 25.

Next, the structure of the non-volatile memory device 1 is described in detail with reference to FIG. 1. In this example, the memory portion 5 includes a first memory cell array (hereinafter, the memory cell array 20a) and a second memory cell array (hereinafter, the memory cell array 20b). The memory cell arrays 20a and 20b are arranged on the underlayer so as to be aligned in the Y-direction.

As shown in FIG. 1, the global bit lines 10 are provided above an interlayer insulating film 65 that insulates each element of the circuit 6 from other. A first select element (hereinafter, a select transistor 30a) is provided between the memory cell array 20a and one global bit line 10. On the other hand, a second select element (hereinafter, a select transistor 30b) is provided between the memory cell array 20b and another global bit line 10. In the cross section of FIG. 1, the select transistor 30a includes a gate electrode 35a, and the select transistor 30b includes a gate electrode 35b. Both of the gate electrodes 35a and 35b extend in the Y-direction.

A second wiring (hereinafter, an inter-gate connection 40) is provided between one group of global bit lines 10 provided under the memory cell array 20a and another group of global bit lines 10 provided under the memory cell array 20b. The inter-gate connection 40 is provided on the same level as the global bit lines 10, and electrically connects the gate electrode 35a and the gate electrode 35b.

In the embodiment, a first plug (hereinafter, a plug 50) is provided to electrically connect the gate electrode 35a and the inter-gate connection 40. The plug 50 is in contact with the inter-gate connection 40 at one end (the lower end) thereof, and in contact with the gate electrode 35a at the side surface thereof. The gate electrode 35b is also electrically connected to the inter-gate connection 40 via another plug 50.

The gate electrode 35 is in contact with the side surface of the plug 50 at a side surface opposite to the memory cell array 20. For example, when the surface facing the memory cell array 20 is the inner face, the gate electrode 35 is in contact with the plug 50 at the outer face thereof. Specifically, the gate electrode 35 is in contact with the plug 50 at the outer face of the turning portion 35e shown in FIG. 3. The circuit 6 is provided below the global bit line 10.

The circuit 6 includes a MOS (metal oxide semiconductor) transistor 60 provided on the upper surface of the underlayer, a wiring 67, a contact plug 68, and a connection terminal 69, for example. The interlayer insulating film 65 is provided for electrically insulating these circuit elements from each other.

The MOS transistor 60 includes an active area 61 provided in the underlayer, for example a silicon wafer, a gate insulating film 62, a gate electrode 63, and source drain regions 64. An STI (shallow trench isolation) 66 is provided between active areas 61 adjacent to each other in Y-direction.

On the other hand, the wiring layer 7 provided on the memory cell arrays 20a and 20b includes a third wiring (hereinafter, an wiring 71) electrically connected to each memory cell array 20. The wiring 71 is provided in an interlayer insulating film 73, and is electrically connected to, for example, the word line 25 of the memory cell array 20. A pad wiring 81 is provided on the interlayer insulating film 73. The pad wiring 81 is covered with an insulating film 83 and a protection film 85.

As shown in FIG. 1, the connection terminal 69 of the circuit 6 is electrically connected to the wiring 71 via a second plug (hereinafter, a plug 55). That is, the circuit 6 and the memory cell array 20 are electrically connected by the plug 55 and the wiring 71.

The plugs 50 and 55 are contact plugs formed by the same step of a manufacturing process, for example. The gate electrode 35 and the inter-gate connection 40 are electrically connected by the plug 50. That is, another end of the plug 50 on a side opposite to the one end in contact with the inter-gate connection 40 (an upper surface of the plug 50) is not connected to an overlying wiring 71, and covered with an insulating film. On the other hand, the plug 55 may be connected to the overlying wiring 71.

Thus, it may become possible to simplify the manufacturing process by making electrical connection via the plug 50 between the gate electrode 35 and the inter-gate wiring 40. In the case where the gate electrode 35 and the inter-gate connection 40 are directly brought in contact with each other, the gate electrode 35 is in contact with the inter-gate connection 40 via a contact hole, for example. The gate electrode 35 is formed on the insulating film 16 so as to be in contact with an exposed portion of the inter-gate connection in the contact hole. Subsequently, an insulating film is formed so as to cover the gate electrode 35, and contact hole is formed for providing a plug 55. In contrast to this, in the embodiment, a contact hole 51 for providing the plug 50 is formed simultaneously with a contact hole 53 for providing the plug 55 (FIG. 7B). Hence, the process step that forms a contact hole for exposing the inter-gate connection 40 in the insulating film 16 can be omitted, for example.

The inter-gate connection 40 is provided so as to avoid interfering with the plug 55. That is, it becomes possible to downsize the non-volatile semiconductor memory device by using the inter-gate connection 40, avoiding interfering with the plug 55 in a portion where the gate electrode 35 extending in the Y-direction and the plug 55 extending in the Z-direction cross each other.

There is a case where a word line WL is electrically connected to the underlying circuit 6 in the shunt region SNT between the memory cell arrays 20a and 20b, for example. Each word line WL is leads out from a word line hookup portion SK shown in FIG. 1 to the overlying wiring 71 via a contact plug, and is also electrically connected to the underlying circuit 6 via the plug 74, the connection terminal 69, and the contact plug 68. Here, the word line hookup portion SK is disposed on the upper side of the inter-gate connection 40 and the plug 55. In this case, it is possible to draw a layout so as to avoid the interference between the plug 55 and the inter-gate connection 40.

Since the gate electrode 35 may be formed by utilizing a sidewall as described later, it is difficult to flexibly draw a layout of a gate electrode 35. On the other hand, a layout of the inter-gate connection 40 provided at one level lower than the gate electrode 35 is more flexibility than layout of the gate electrode 35. Then, using the layout of the inter-gate connection 40 to avoid interference between the plug 55 and the inter-gate connection 40, it is advantageous for shrinking the non-volatile semiconductor memory device.

Next, a method for manufacturing the non-volatile memory device 1 is described with reference to FIGS. 4 to 9.

FIGS. 4 to 9 are schematic views showing one example of the manufacturing process of the non-volatile memory device 1 according to the embodiment. The drawings show a process in which the memory portion 5 is formed on the circuit 6 provided, for example, on a silicon wafer.

Figure 4:
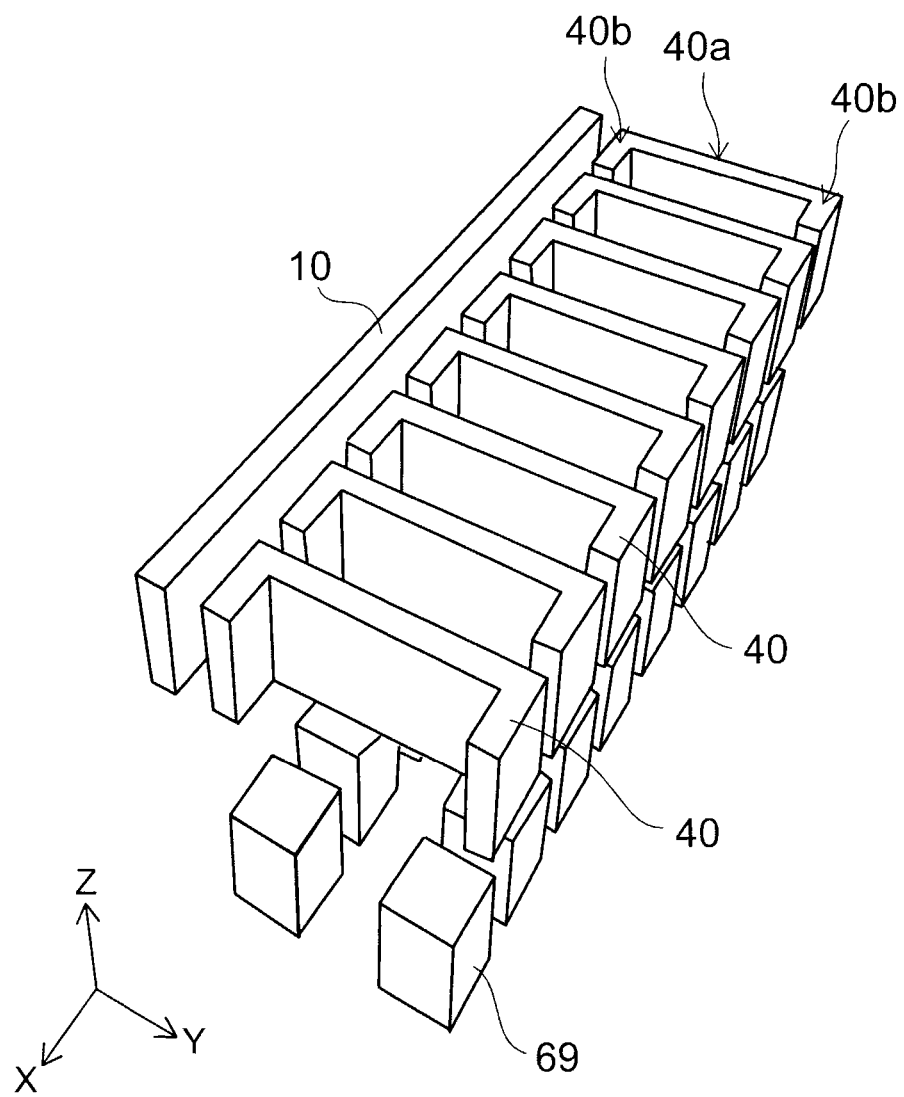
Figure 5:
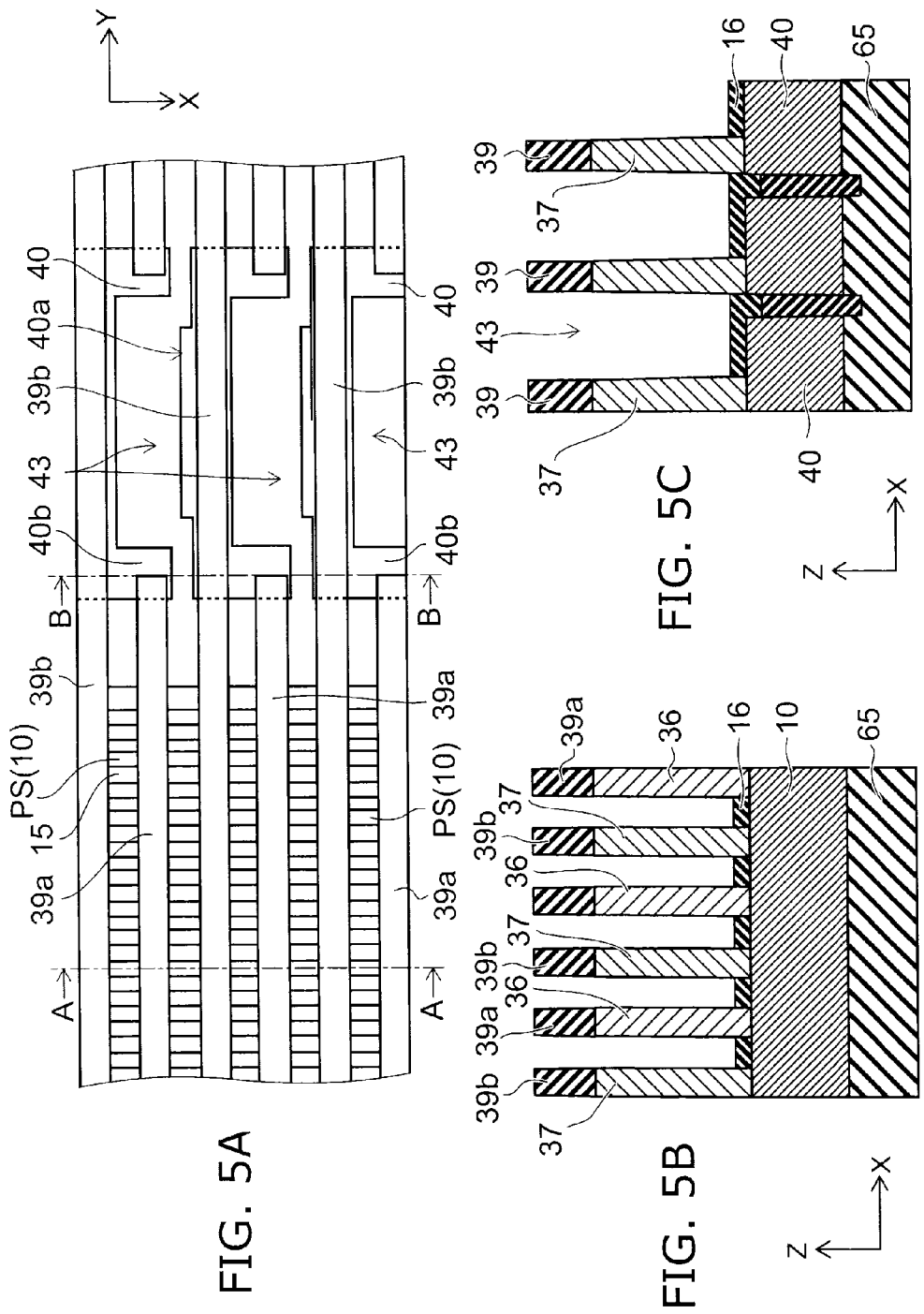

FIG. 4 is a perspective view schematically showing the global bit line 10 and the inter-gate connection 40 formed on the circuit 6. In the drawing, the interlayer insulating film 65 is omitted in order to show the connection terminal 69 of the circuit 6. Although one global bit line 10 is illustrated for convenience, a plurality of global bit lines 10 (not shown) are provided in this process.

The global bit line 10 and the inter-gate connection 40 are provided in the same wiring layer, and are formed simultaneously. For example, a metal film of tungsten (W) or the like is formed on the interlayer insulating film 65 using the CVD method, and then the configuration of the global bit line 10 and the inter-gate connection 40 are formed by a selective etching.

As shown in FIG. 4, the global bit line 10 is formed in a stripe shape extending in the X-direction. On the other hand, the inter-gate connection 40 has a portion 40a extending in the Y-direction and portions 40b bent in the X-direction at both ends of the portion 40a. That is, the inter-gate connection 40 is formed to avoid overlapping with the underlying connection terminal 69 in the top view. The global bit line 10 and the inter-gate connection 40 are disposed in the same wiring layer, and may be formed simultaneously in the same processing step.

Next, FIG. 5A is a plan view schematically showing the upper surface of the wafer, and FIGS. 5B and 5C show cross sections taken along line A-A and line B-B shown in FIG. 5A, respectively. A polysilicon (PS) wall, for example, is deposited above each global bit line 10. For example, a polysilicon layer is formed above the global bit line 10, and then selectively etched so that the PS-wall remains on each global bit line 10. After that, an insulating film 15 (see FIG. 7B) is deposited between the PS-walls. Further, an insulating film 39 is deposited above the PS-walls and the insulating film 15.

As shown in FIG. 5A, the insulating film 39 includes portions formed in a stripe shape extending in the Y-direction (mask portions 39a and 39b). One end of the mask portion 39a is located on the bent portion 40b of the inter-gate connection 40 such that the mask portion 39a does not extend over an interconnecting space 43 between adjacent inter-gate connections 40. On the other hand, the mask portion 39b extends over the inter-gate connection 40.

Next, the PS-wall and the insulating film 15 are etched using the insulating film 39 as a mask, and the PS-wall is processed like a pillar shape (PS-pillar). As shown in FIGS. 5B and 5C, a stripe core 36 including the PS-pillars and part of insulating film 15 is formed under the mask portion 39a, and a stripe core 37 including the SP-pillars and another part of insulating film 15 is formed under the mask portion 39b.

The stripe core 36 does not extend over the interconnecting space 43 between adjacent inter-gate connections 40, and the stripe core 37 extends over the extending portion 40a of the inter-gate connection 40. That is, in the top view, the stripe core 36 is formed so as not to overlap with the connection terminal 69 of the circuit 6. The stripe core 37 is formed above the global bit line 10 and on at least part of the inter-gate connection 40.

Then, the insulating film 16 is deposited above the entire surface of wafer and etchback is performed to obtain a structure in which the insulating film 16 is disposed between the stripe core 36 and the stripe core 37 as shown in FIG. 5B, and between stripe cores 37 as shown in FIG. 5C. The insulating film 16 is formed such that the upper face of the insulating film 16 is lower than the upper faces of the stripe cores 36 and 37.

Figure 6:
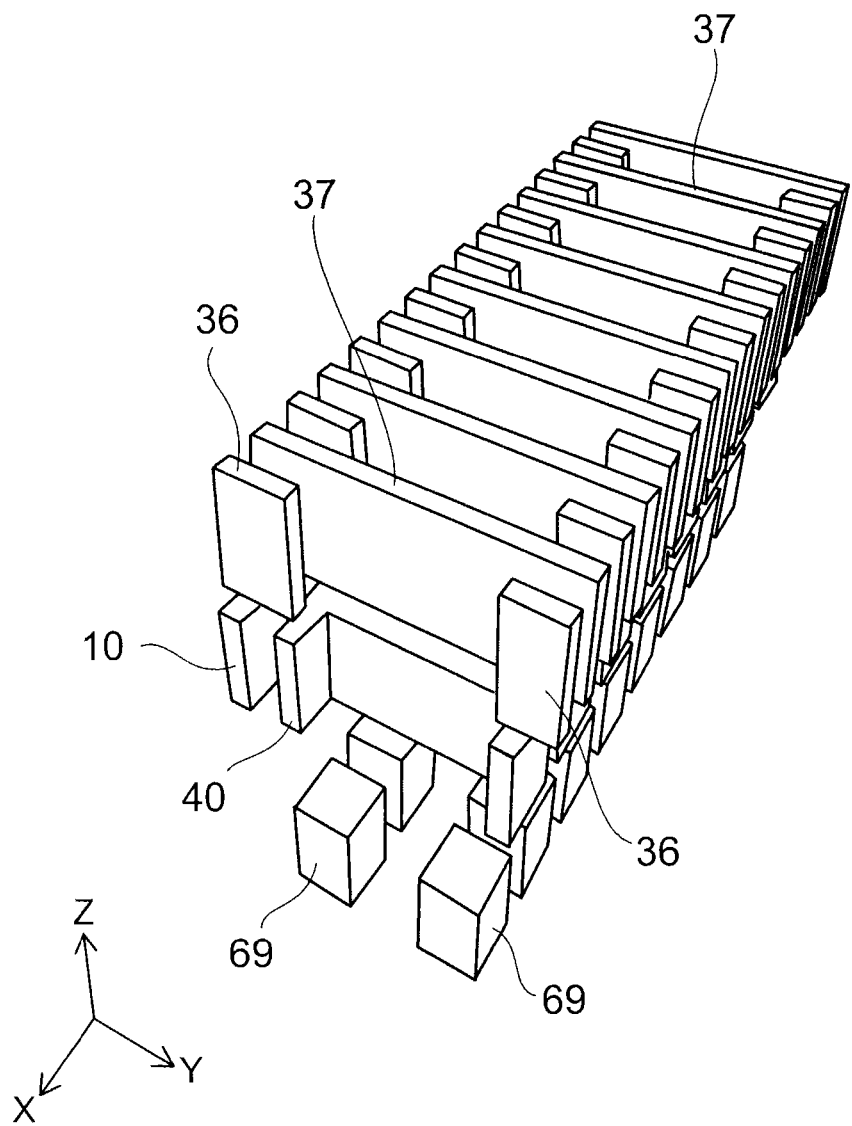

FIG. 6 is a perspective view schematically showing the arrangement of the stripe cores 36 and 37. In the drawing, the illustration of insulating films is omitted in order to show the arrangement of the global bit line 10, the inter-gate connection 40, the connection terminal 69, and the stripe cores 36 and 37.

As shown in FIG. 6, the stripe core 36 does not extend on the interconnecting space 43 between inter-gate connections 40 adjacent to each other in the X-direction. On the other hand, the stripe core 36 extends over a portion of the inter-gate connections 40 avoiding the connection terminal 69. As a result, an interconnecting space 43 is ensured between stripe cores 37 adjacent to each other in the X-direction. As described later, the plug 55 is formed in the interconnecting space 43 so as to be connected to the connection terminal 69.

Next, the gate insulating film 33 and the gate electrode 35 are formed on the side surfaces of the stripe cores 36 and 37 (see FIG. 8B). For example, a metal film that covers the stripe cores 36 and 37 is formed via the insulating film 33, and then the metal film is etched back using RIE (reactive ion etching) so that a portion that serves as the gate electrode 35 is left on the side surfaces of the stripe cores 36 and 37. That is, parts of the metal film formed between the stripe core 36 and the stripe core 37 and on upper portions thereof are removed (etched back) using anisotropic etching of RIE. Polysilicon or titanium nitride (TiN), for example, may be used for the metal film that forms the gate electrode 35. The gate electrode 35 is formed on the insulating film 16. That is, the gate electrode 35 is electrically isolated from the global bit line 10 via the insulating film 16.

Thus, the gate electrode 35 is formed along the side surfaces of the stripe cores 36 and 37. That is, the layout of the gate electrode 35 depends on the pattern of the stripe cores 36 and 37, and it is difficult to draw a flexible design thereof.

Subsequently, an insulating film ZT is formed in the shunt portion SNT and between the gate electrodes 35.

FIGS. 7A and 7B are schematic views showing the wafer in which the contact holes 51 and 53 are formed. FIG. 7A is a plan view showing the upper surface of the wafer, and FIG. 7B is a cross-sectional view taken along line C-C shown in FIG. 7A.

A first contact hole (hereinafter, the contact hole 51) is formed in the insulating film ZT so as to expose an upper surface of inter-gate connection 40 and a side surface of turning portion 35e. And a second contact hole (hereinafter, the contact hole 53) is formed in the insulating film ZT so as to expose an upper surface of the connection terminal 69 at the same time.

The contact holes 51 and 53 can be formed simultaneously using anisotropic etching of RIE. Here, the contact hole 51 removes the insulating film ZT and exposes the upper surface of the inter-gate connection 40, while exposing the side surface of the gate electrode 35. Here, the etching rate of the gate electrode 35 and the inter-gate connection 40 is set smaller than the etching rate of the insulating film. As a result, the bottom face of the contact hole 51 is located in the upper surface of the inter-gate connection 40, and the bottom face of the contact hole 53 is located in the upper surface of the connection terminal 69. The gate electrode 35 is left in the contact hole 53, since it is not removed through the etching process. The contact holes 51 and 53 may be formed in a tapered shape such that a width thereof becomes narrower as the distance from the upper surface of the insulating film 15 becomes deeper.

When the contact hole 51 has a tapered shape, an etching mask (not shown) formed on the insulating film 15 may have a larger opening than the bottom area of the contact hole 51 formed in the upper surface of the inter-gate connection 40, for example. Thereby, it is easy to form the contact holes 51 and 53 by photolithography, and then the etching process of the insulating film 15 becomes easy.

The turning portion 35e of the gate electrode 35a is exposed at the sidewall of the contact hole 51. That is, the gate electrode 35a is formed on the side surface of the stripe core 36 (see FIG. 3). The portion 35aa extending in the Y-direction is formed on one side surface of the stripe core 36, and the portion 35ab extending in the opposite direction (the −Y direction) is formed on the other side surface of the stripe core 36. The turning portion 35e is formed in an end portion provided on the inter-gate connection 40.

A width of the turning portion 35e exposed form the contact hole 51 becomes thinner from bottom to top in the Z-direction, for example. That is, the width in the Y-direction of the turning portion 35e is formed so as to become narrower as a distance from the inter-gate connection 40 increases in the Z-direction.

Next, FIGS. 8A to 8C are schematic views showing the wafer in which electrically conductive material, such as metal is buried in the contact holes 51 and 53 so as to form the plugs 50 and 55. FIG. 8A is a plan view showing the upper surface of the wafer. FIG. 8B is a cross-sectional view taken along line D-D shown in FIG. 8A, and FIG. 8C is a cross-sectional view taken along line E-E.

A barrier metal and a metal, for example, are buried in the contact holes 51 and 53, and the upper surface of the wafer is planarized. For example, TiN may be used as the barrier metal covering the inner surfaces of the contact holes 51 and 53. For example, Tungsten (W) may be used as the metal for filling the contact holes 51 and 53. Since the plug 50 is in contact with the side surface of the gate electrode 35 at full length thereof, it is possible to reduce contact resistance therebetween.

As shown in FIG. 8C, the plug 50 is in contact with the inter-gate connection 40 at the bottom of the contact hole 51. The plug 50 is in contact with the gate electrode 35 at the sidewall of the contact hole 51. Thereby, electrical connection is obtained between the gate electrode 35 and the inter-gate connection 40. The plug 50 has a shape in which its width becomes wider as a distance from the inter-gate connection 40 increases in the Z-direction.

On the other hand, one end of the plug 55 is in contact with the connection terminal 69 of the circuit 6 at the bottom of the contact hole 53. The other end of the plug 55 is exposed at the upper surface of the insulating film 15.

As shown in FIG. 8B, the gate electrode 35a is formed on the side surface of the stripe core 36 via the gate insulating film 33, and the gate electrode 35b is formed on the side surface of the stripe core 37 via the gate insulating film 33. Thereby, the select transistor 30 is formed in a portion including the PS-pillar (i.e. the element portion 31) of the stripe cores 36 and 37.

The gate electrode 35 is formed using anisotropic etching of RIE, and therefore has a shape in which the thickness becomes thinner as progressing in the Z-direction. That is, the gate electrode 35 is formed in a shape in which the thickness becomes thinner (that is, the width in the X-direction becomes narrower) as a distance from the global bit line 10 increases in the Z-direction.

Figure 9A:
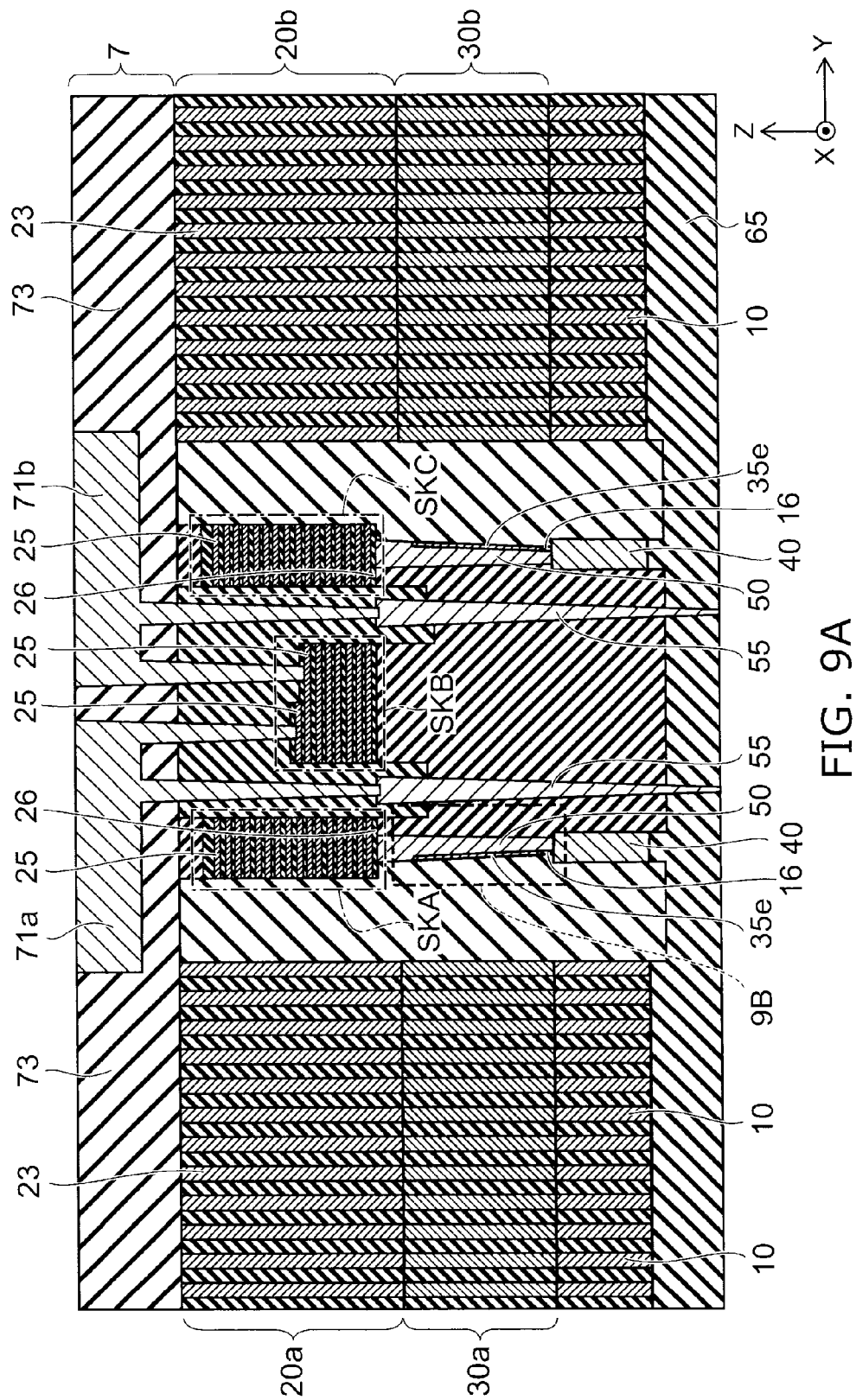

Next, as shown in FIG. 9A, the memory cell array 20 and the wiring layer 7 are formed above the select transistor 30. FIG. 9A is a cross-sectional view taken along line F-F shown in FIG. 8A, for example.

The word line 25 is stacked on the select transistors 30a and 30b and selectively etched into a prescribed shape, for example. Subsequently, the memory layer 27 and the local bit line 23 are formed in a trench provided between word lines 25 to complete the memory cell arrays 20a and 20b (see FIG. 2).

As shown in FIG. 9A, the hookup portion SK includes stacked bodies SKA, SKB and SKC, and the stacked bodies SKA and SKC of word lines 25 and insulating films are disposed also on the plug 50. However, since the stacked bodies SKA and SKC are stacked on the plug 50 via an insulating film 26, the plug 50 is not electrically connected to each stacked body.

Figure 9B:
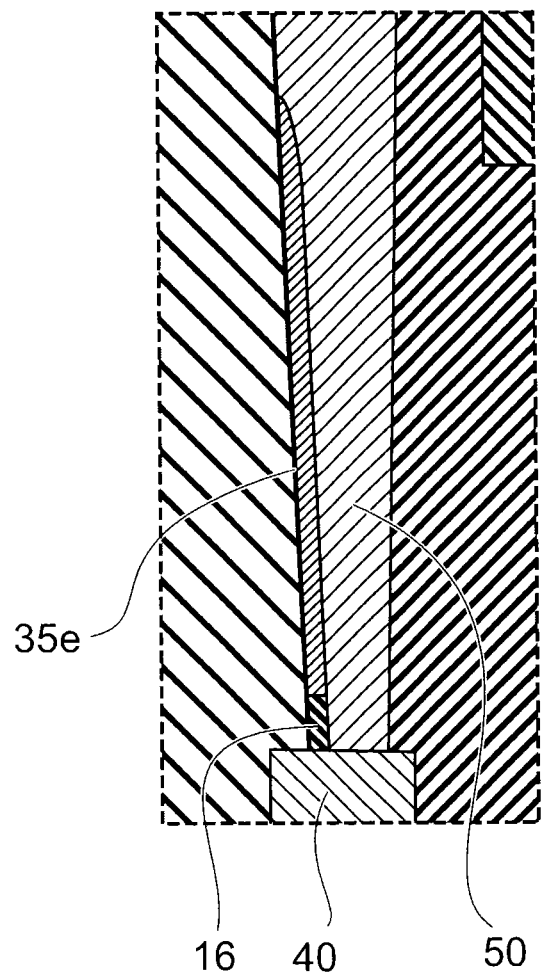

FIG. 9B is an enlarged view of a region 9B shown in FIG. 9A. As shown in the drawing, the plug 50 is in contact with the turning portion 34e of the gate electrode 35 exposed at the sidewall of the contact hole 51. The plug 50 is electrically connected only to the gate electrode 35 and the inter-gate wiring 40.

Since the plug 50 for the connection of a gate electrode 35C can be disposed below the hookup portion SK, it may be possible to downsize the layout space of the hookup portion SK.

Subsequently, the interlayer insulating film 73 is formed above the memory cell array 20, and wirings 71a and 71b are formed in the interlayer insulating film 73. The wirings 71a and 71b are electrically connected to one of the word lines 25 included in a stacked body SKB. The wiring 71a and 71b include plugs 74 connecting to the plugs 55. Here, the stacked body SKB is provide with a staircase form, wherein part of each word line 25 is exposed at any one of steps in the staircase form. Thus, the word lines 25 of all the layers may be electrically connected to the underlying circuit 6 via the wiring 71 and the plug 55. FIG. 9A shows one example, where the wirings 71a and 71b are respectively connected to word lines 25 in different steps. The wirings 71a and 71b are electrically connected also to the plug 55. Then, the pad wiring 81 and the insulating films 83 and 85 are formed on the wiring layer 7; thus, the non-volatile memory device 1 is completed (see FIG. 1).

As shown in FIG. 9A, the word line 25 is electrically connected to the circuit 6 via the wiring 71 of the wiring layer 7 and the plug 55. The circuit 6 applies a voltage to the word line 25 to drive a prescribed memory cell MC.

As mentioned above, the non-volatile memory device 1 according to the embodiment includes the two memory cell arrays 20a and 20b. A vertical wiring in the Z-direction (i.e. the plug 55) is formed between the two memory cell arrays 20a and 20b, and makes electrical connection between the circuit 6 and each memory cell array. On the other hand, a horizontal wiring (i.e. the gate electrode 35) formed on the side surfaces of the stripe cores 36 or 37 extends in the Y-direction. In this example, using the inter-gate connection 40, the horizontal wiring is made to avoid interference with the vertical wiring; thereby, a margin for avoiding interference between the wirings is ensured in the Z-direction.

From another point of view, the select transistor 30a having the gate electrode 35a extending in the Y-direction and a select transistor 30c (a third select element) having the gate electrode 35b extending in the Y-direction likewise are formed between the memory cell array 20a and the global bit line 10. The select transistor 30a and the select transistor 30c are aligned in the X-direction on the global bit line 10, for example (see FIG. 2).

On the other hand, the select transistor 30b having the gate electrode 35a and a select transistor 30d (a fourth select element) having the gate electrode 35b are formed between the memory cell array 20b and the global bit line 10. The select transistor 30b and the select transistor 30c are disposed in the X-direction on the global bit line 10, for example (see FIG. 2).

As described in the manufacturing process mentioned above, one of the gate electrodes 35a in memory cell array 20a and the gate electrode 35a in memory cell array 20b are electrically connected via the inter-gate connection 40. Then, the gate electrode 35 of one of select transistors 30 adjacent to each other in the X-direction is formed so as to avoid interference using the layout of the inter-gate connection 40; thereby, a layout space 43 is ensured for forming the plug 55.

Furthermore, the plug 50 may be formed simultaneously with the plug 55, and the plug 50 electrically connects between the gate electrode 35 and the inter-gate wiring 40. Thereby, the manufacturing process thereof can be simplified, and it becomes possible to improve manufacturing efficiency. Furthermore, the plug 50 has a tapered shape, where the upper end of the plug 50 is larger than the lower end thereof contacting the inter-gate wiring 40. Thereby, it is easy to form the plug 50 by photolithography and etching, then it becomes possible to improve manufacturing yield.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention. Additionally, the embodiments described above can be combined mutually.

What is claimed is:

1. A non-volatile memory device comprising:
   a first wiring provided above an underlayer;
   a first memory cell array provided above the first wiring and including memory cells;
   a first select element including a first control electrode provided between the first wiring and the first memory cell array;
   a second wiring provided at the same level as the first wiring, and electrically connected to the first control electrode; and
   a first plug electrically connecting the first control electrode and the second wiring, one end of the first plug being in contact with the second wiring, and a side surface of the first plug being in contact with the first control electrode.

2. The device according to claim 1, further comprising:
   a circuit provided between the underlayer and the first wiring and electrically connect to drive the first memory cell array;
   an wiring layer provided above the first memory cell array and including a third wiring electrically connected to the first memory cell array; and
   a second plug electrically connecting the circuit and the third wiring,
   the second wiring being provided so as to avoid interference with the second plug.

3. The device according to claim 2, further comprising:
a fourth wiring extending in a second direction crossing a first direction, the first wiring extending in the first direction; and
a fifth wiring extending in a third direction crossing the first direction and the second direction,
wherein the fourth wiring is connected to the first select element, and the memory cell is disposed at an intersection of the fourth wiring and the fifth wiring.

4. The device according to claim 1, wherein another end of the first plug is covered with an insulating film.

5. The device according to claim 1, further comprising:
a second memory cell array adjacent to the first memory cell array above the underlayer; and
a second select element provided between the underlayer and the second memory cell array, and including a second control electrode,
the second wiring electrically connecting the first control electrode and the second control electrode.

6. The device according to claim 1, wherein
the first wiring extends in a first direction parallel to the underlayer,
the first select element is connected to the first wiring and includes an element portion extending in a second direction perpendicular to a main surface of the underlayer, and
the first control electrode extends in a third direction crossing the first direction in a plane parallel to the main surface of the underlayer and is disposed on a side surface of the element portion via an insulating film.

7. The device according to claim 6, wherein
a thickness of the first control electrode becomes thinner as a distance from the first wiring increases in the second direction at contacting to the first plug.

8. The device according to claim 6, wherein a thickness of the first plug becomes wider as a distance from the first wiring increases in the second direction.

9. The device according to claim 6, wherein
the first control electrode has a first portion and a second portion extending in the third direction, and a turn-around portion in contact with the first plug, the turn-around portion electrically connecting the first portion and the second portion, and
the first portion and the second portion face each other via the element portion.

10. The device according to claim 9, wherein the first plug is in contact with a side surface of the first control gate electrode in the turn-around portion.

11. The device according to claim 6, further comprising:
a circuit provided between the underlayer and the first wiring and electrically connected to drive the first memory cell array;
a wiring layer provided above the first memory cell array and including a third wiring electrically connected to the first memory cell array; and
a second plug electrically connecting the circuit and the third wiring,
the second wiring being provided so as to avoid interference with the second plug.

12. The non-volatile memory device according to claim 11, further comprising:
a second memory cell array provided above the underlayer and adjacent to the first memory cell array in the third direction;
a second select element provided between the underlayer and the second memory cell array and including a second control electrode extending in the third direction;
a third select element provided between the first wiring and the first memory cell array, the third select element being adjacent to the first select element in the first direction, and including a third control electrode extending in the third direction; and
a fourth select element provided between the underlayer and the second memory cell array, the fourth select element being adjacent to the second select element in the first direction, and sharing the third control electrode with the third select element,
the second wiring electrically connecting the first control electrode and the second control electrode,
the third control electrode being provided on the second wiring.

* * * * *